United States Patent
Sun et al.

(10) Patent No.: US 10,526,720 B2
(45) Date of Patent: Jan. 7, 2020

(54) APPARATUS FOR FORMING CRYSTALLINE SHEET FROM A MELT

(71) Applicant: Varian Semiconductor Equipment Associates, Inc., Gloucester, MA (US)

(72) Inventors: Dawei Sun, Lynnfield, MA (US); Peter L. Kellerman, Essex, MA (US); Gregory Thronson, Groveland, MA (US)

(73) Assignee: VARIAN SEMICONDUCTOR EQUIPMENT ASSOCIATES, INC., Glouchester, MA (US)

( * ) Notice: Subject to any disclaimer, the term of this patent is extended or adjusted under 35 U.S.C. 154(b) by 197 days.

(21) Appl. No.: 14/830,140

(22) Filed: Aug. 19, 2015

(65) Prior Publication Data

US 2017/0051430 A1   Feb. 23, 2017

(51) Int. Cl.
*C30B 15/06* (2006.01)
*C30B 29/20* (2006.01)

(52) U.S. Cl.
CPC .............. *C30B 15/06* (2013.01); *C30B 29/20* (2013.01)

(58) Field of Classification Search
None
See application file for complete search history.

(56) References Cited

U.S. PATENT DOCUMENTS

| | | | |
|---|---|---|---|
| 4,289,571 A | * | 9/1981 | Jewett .................... C30B 15/06 117/212 |
| 7,855,087 B2 | | 12/2010 | Kellerman et al. |
| 8,685,161 B2 | | 4/2014 | Locher et al. |
| 8,685,162 B2 | | 4/2014 | Kellerman et al. |
| 8,764,901 B2 | | 7/2014 | Kellerman et al. |
| 2009/0231597 A1 | * | 9/2009 | Rowland ................ G01B 21/12 356/625 |
| 2011/0271899 A1 | * | 11/2011 | Kellerman .............. C30B 15/06 117/27 |
| 2013/0112135 A1 | | 5/2013 | Carlson et al. |
| 2013/0213295 A1 | | 8/2013 | Mackintosh et al. |
| 2014/0096713 A1 | | 4/2014 | Sinclair et al. |
| 2014/0209016 A1 | | 7/2014 | Kellerman et al. |

OTHER PUBLICATIONS

A.Y. Vorobyev, et al., Multifunctional surfaces produced by femtosecond laser pulses, Journal of Applied Physics, 2015, pp. 033103-1 tp 033103-5, vol. 117, AIP Publishing.

(Continued)

*Primary Examiner* — Erin F Bergner

(57) ABSTRACT

An apparatus for drawing a crystalline sheet from a melt. The apparatus may include a crucible configured to contain the melt and having a dam structure, where the melt comprises an exposed surface having a level defined by a top of the dam structure. The apparatus may further include a support apparatus disposed within the crucible and having an upper surface, wherein the crystalline sheet is maintained flush with the exposed surface of the melt when drawn over the support apparatus, and may include a melt-back heater directing heat through the upper surface of the support apparatus to partially melt the crystalline sheet when the crystalline sheet is drawn over the support apparatus.

16 Claims, 4 Drawing Sheets

(56) References Cited

OTHER PUBLICATIONS

Peter L. Kellerman, et al., Apparatus and Method for Controlling Thickness of a Crystalline Sheet Grown on a Melt, U.S. Appl. No. 14/517,217, filed Oct. 17, 2014.
Peter L. Kellerman, et al., System and Method for Crystalline Sheet Growth Using a Cold Block and Gas Jet, U.S. Appl. No. 14/226,991, filed Mar. 27, 2014.
Peter L. Kellerman, et al., Apparatus for Controlling Heat Flow Within a Silicon Melt, U.S. Appl. No. 14/227,006, filed Mar. 27, 2014.

* cited by examiner

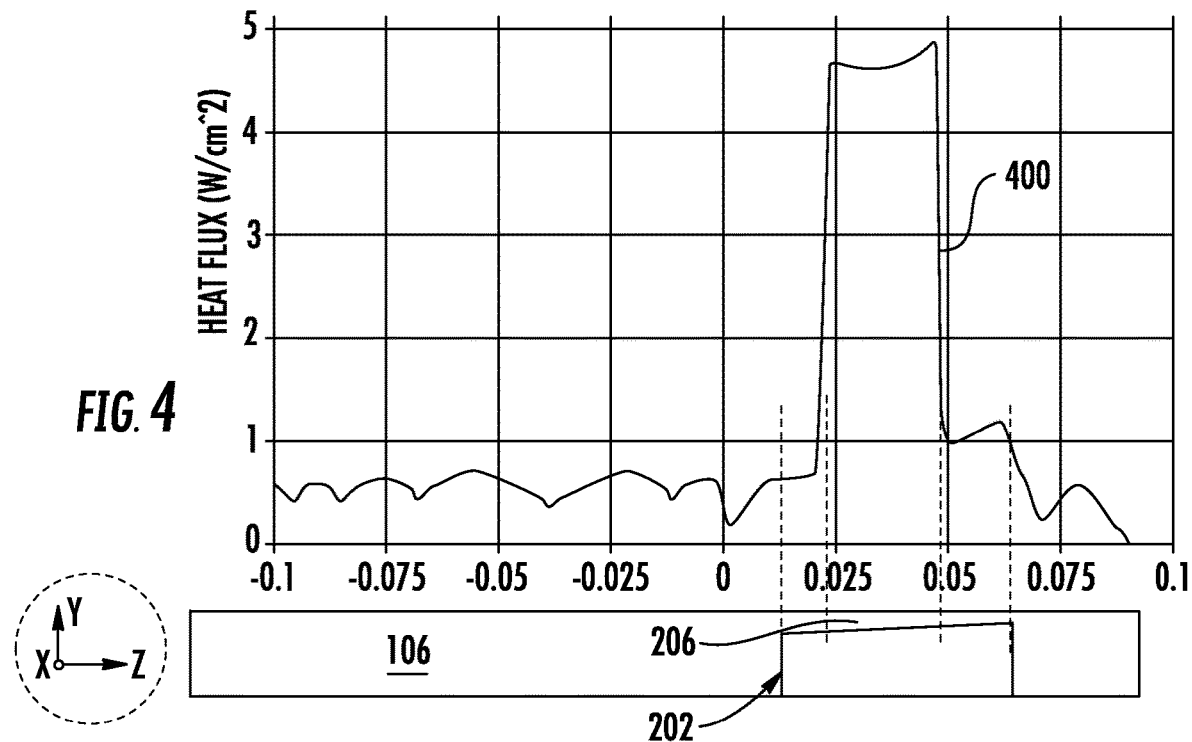

APPARATUS FOR FORMING CRYSTALLINE SHEET FROM A MELT

FIELD

The present embodiments relate to growth of crystalline material from a melt and more particularly to forming a single crystalline sheet from a melt.

BACKGROUND

Sapphire is the second most widely used synthetic monocrystalline material next to silicon. Sapphire represents one crystalline form of aluminum oxide (Al03) and may be formed by growing crystalline boules of sapphire from a melt, for example. Applications for sapphire include use as light emitting diode (LED) substrates, optical windows, silicon-on-sapphire (SOS), mobile devices, etc. All these applications entail single crystal (monocrystalline) sapphire in the form of thin crystalline sheets. Accordingly, when grown as boules, sapphire sheets or wafers may be formed by slicing the boules after growth to form a sapphire sheet or substrate of a target thickness.

In the case of silicon growth, monocrystalline silicon may be grown by a so-called floating silicon method (FSM). In the FSM method crystalline sheets of silicon are formed from a silicon melt by cooling a portion of the melt surface to crystallize a layer at the melt surface, and by pulling the crystalline layer in a horizontal direction. In this manner, a sheet of monocrystalline silicon may be continuously drawn as a ribbon from the silicon melt. Fortuitously, the density of monocrystalline silicon is less than the density of the silicon melt, causing the growing silicon ribbon to float on the melt surface. This allows the ribbon to be conveniently drawn along the melt surface and separated from the silicon melt at a target location. Other materials systems where monocrystalline sheet formation from a melt may be desirable, including sapphire, exhibit higher density in the crystalline phase than in the liquid phase. Accordingly, techniques for forming sapphire by drawing a horizontally oriented sheet from a melt are lacking. The present disclosure is provided in view of these considerations and other considerations.

SUMMARY

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

In one embodiment, an apparatus for drawing a crystalline sheet from a melt may include a crucible configured to contain the melt and having a dam structure, where the melt comprises an exposed surface having a level defined by a top of the dam structure. The apparatus may further include a support apparatus disposed within the crucible and having an upper surface, wherein the crystalline sheet is maintained flush with the exposed surface of the melt when drawn over the support apparatus and may include a melt-back heater directing heat through the upper surface of the support apparatus to partially melt the crystalline sheet when the crystalline sheet is drawn over the support apparatus.

In another embodiment, In a further embodiment, an apparatus for growing a crystalline sheet from a melt may include a crucible configured to contain the melt and having a dam structure, the melt having an exposed surface defined by a top of the dam structure. The apparatus may also include a crystallizer disposed above the melt to remove heat in a cooling zone from the exposed surface of the melt, wherein a leading edge of the crystalline sheet forms at the exposed surface in the cooling zone, the crystalline sheet having an initial sheet thickness; and a support apparatus disposed within the crucible downstream of the crystallizer and having an upper surface, wherein the crystalline sheet is maintained flush with the exposed surface of the melt when drawn over the support apparatus.

In a further embodiment, a method of growing a crystalline sheet from a melt may include: forming the crystalline sheet on an exposed surface of a melt in a crucible having a dam structure, the exposed surface defined by a top of the dam structure; measuring a position of a surface of the crystalline sheet; placing an upper surface of a support apparatus at a first level based on the measured first position; and drawing the crystalline sheet along a first direction over the upper surface of the support apparatus wherein the crystalline sheet is maintained flush with the exposed surface.

In a further embodiment, an apparatus for drawing a crystalline sheet from a melt may include a crucible configured to contain the melt and having a dam structure, the melt comprising an exposed surface having a level defined by a top of the dam structure; and a support apparatus disposed within the crucible and having an upper surface, wherein the crystalline sheet is maintained flush with the exposed surface of the melt when drawn over the support apparatus; and a melt-back heater directing heat through the upper surface of the support apparatus to partially melt the crystalline sheet when the crystalline sheet is drawn over the support apparatus. The apparatus may further include a gas jet disposed downstream of the dam structure directing a stream of gas to the melt adjacent the dam structure.

In a further embodiment, an apparatus for drawing a crystalline sheet from a melt may include a crucible configured to contain the melt and having a dam structure, the melt comprising an exposed surface having a level defined by a top of the dam structure; and include a gas jet disposed downstream of the dam structure directing a stream of gas to the melt adjacent the dam structure.

BRIEF DESCRIPTION OF THE DRAWINGS

FIG. 4 depicts an exemplary heat flow profile provided by embodiments of support apparatus of FIG. 3;

FIG. 5A and FIG. 5B depict two different scenarios during processing of a crystalline sheet using the support apparatus of FIG. 3 in accordance with embodiments of the disclosure.

DETAILED DESCRIPTION

The present embodiments provide apparatus and techniques for forming monocrystalline sheets from a melt. Various embodiments may be advantageously employed for growing monocrystalline sheets by drawing the sheets in a horizontal manner along the surface of the melt. In various embodiments, monocrystalline sheets of material such as sapphire may be grown where the monocrystalline sheets have a greater density than the density of the melt.

Figure 1A:
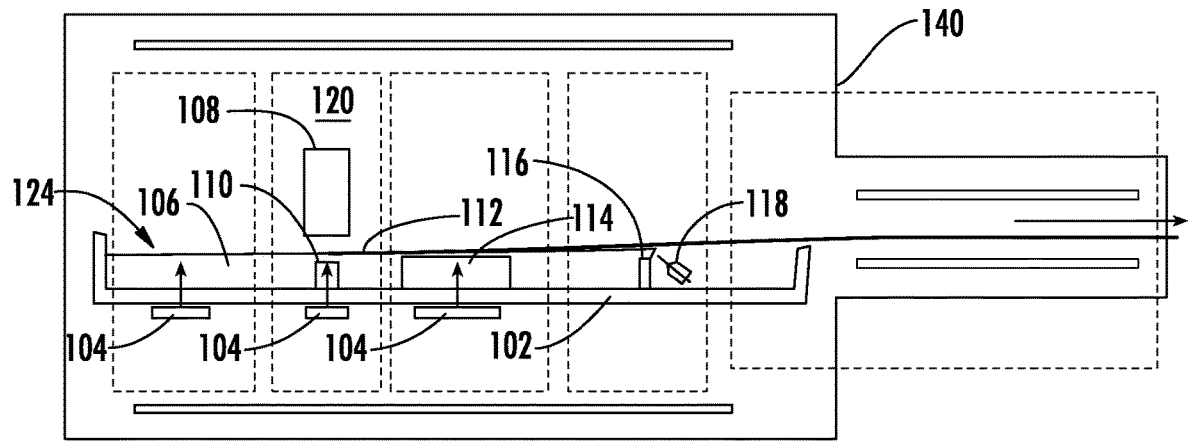
FIG. 1A depicts an apparatus for growing a crystalline sheet from a melt according to various embodiments of the disclosure.
Figure 2A:
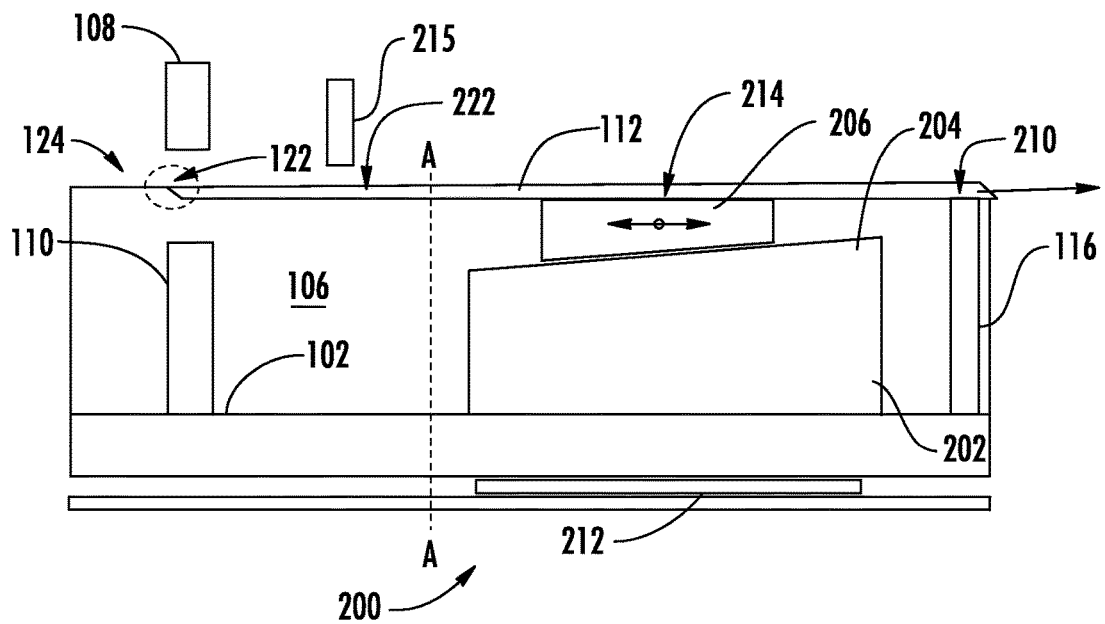
FIG. 2A shows a side view of portions of another apparatus, according to additional embodiments.
Figure 2B:
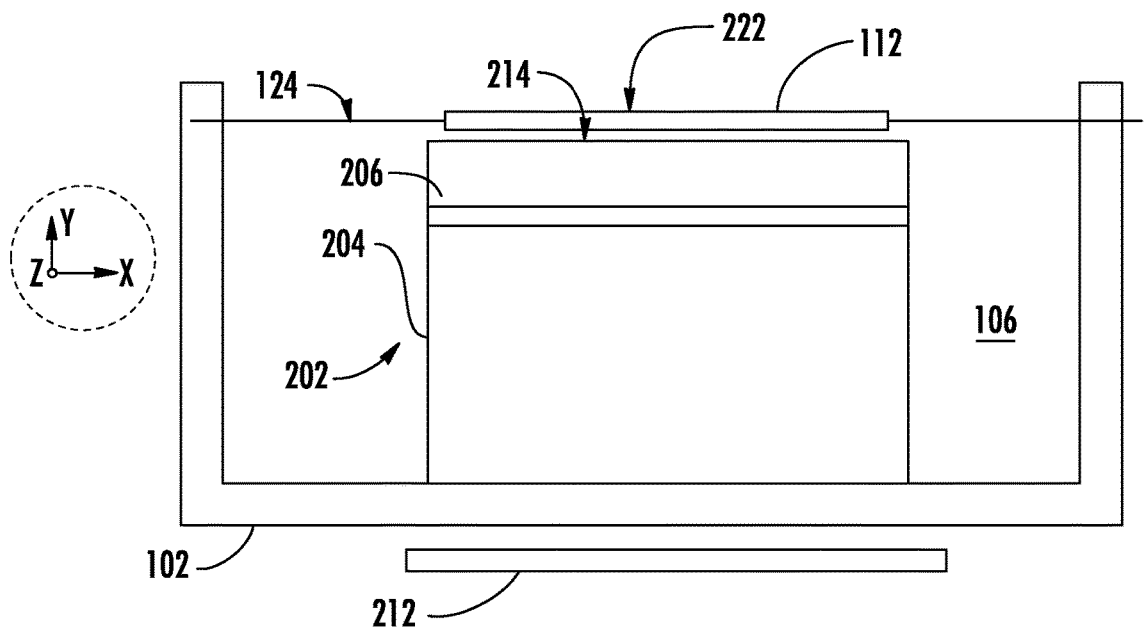
FIG. 2B shows an end view of the apparatus of FIG. 2A.

Turning now to the figures, FIG. 1A depicts an apparatus 100 for growing a crystalline sheet from a melt. FIG. 2A shows a side view of portions of an apparatus 200, where the apparatus 200 may be a variant of the apparatus 100. FIG. 2B shows an end view of the apparatus 200. In various embodiments the apparatus 100 may include a crucible 102 configured to contain a melt 106. The crucible may be heated by various heaters, shown as heaters 104. The heaters 104 may be used to generate and maintain a melt, as well as for other purposes as discussed below. The apparatus 100 may include a crystallizer 108 disposed above the melt 106 to remove heat in a cooling zone 120. In particular the heat may be removed from an (upper) exposed surface 124 of the melt, wherein a leading edge 122 of a crystalline sheet 112 is formed, as shown in FIG. 2A.

The apparatus 100 may further include a heat intensifier 110, disposed under the leading edge 122. The apparatus 100 may also include a dam structure 116. As discussed in more detail below the dam structure 116 may define a level of the exposed surface 124 of the melt 106. The apparatus 100 may further include a support apparatus 114 disposed within the crucible 102 and downstream of the crystallizer 108. As discussed below, the support apparatus 114 or similar support apparatus may include an upper surface whose level is variable along the Y-axis of the Cartesian coordinate system shown. The support apparatus 114 may be used to support the crystalline sheet 112 as well as direct heat to the crystalline sheet 112. In various embodiments for growing a crystalline sheet of sapphire, the crucible 102, heat intensifier 110, and support apparatus 114 may be made from refractory metal such as molybdenum or tungsten.

Figure 1B:
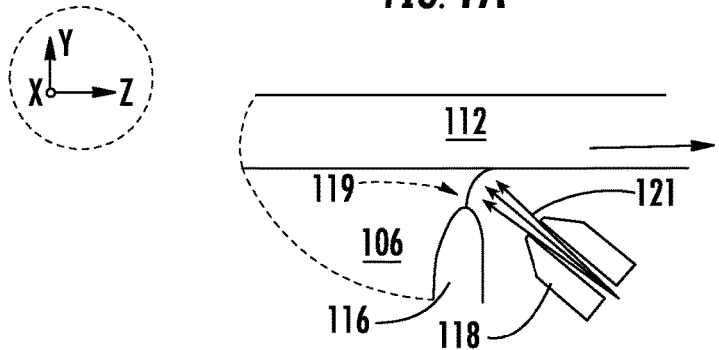
FIG. 1B depicts a close-up of a gas jet according to embodiments of the disclosure.

As further shown in FIG. 1B the crystalline sheet 112 may be drawn by a puller (not shown) to the right in the figure, where the crystalline sheet 112 is separated from the melt 106 as the crystalline sheet 112 is pulled over the dam structure 116. The apparatus 100 may also include a gas jet 118 where the gas jet 118 aids in separation of the crystalline sheet 112 from the melt 106 by directing gas to the underside of the crystalline sheet 112. The gas jet 118 may be disposed downstream of the dam structure 116, directing a stream of gas 121 to the melt 106 adjacent the dam structure 116.

The gas jet 118 may be particularly useful when the melt 106 is alumina (sapphire), where contact angle between the melt 106 and dam structure 116 may be lower. For example, in the case of a Si melt, the contact angle between the silicon melt and a quartz dam structure is 87 degrees, allowing a meniscus 119 to remain stable over a wide range of contact angles, while stability can be maintained by merely pulling upward slightly on the sheet. For embodiments where the melt 106 is sapphire and the dam structure 116 is made from Mo, the contact angle between the melt 106 and dam structure 116 is ~30 degrees. This lower contact angle makes maintain stability more difficult by merely lifting on the crystalline sheet 112. The gas jet 118 may generate a first curvature of the meniscus 119 between the melt 106 and dam structure 116 different than a second curvature of the meniscus 119 between the melt 106 and support apparatus 116 when the gas jet 118 is not present.

In embodiments where the crystalline sheet 112 has a higher density than the melt 106, the support apparatus 114 may maintain the crystalline sheet 112 at a level, such as flush with the exposed surface 124, as shown in FIG. 2A. In other words, the support apparatus 114 may prevent the crystalline sheet 112 from sagging below the exposed surface 124 as the crystalline sheet is drawn away from the crystallizer 108.

In various embodiments the apparatus 100 or apparatus 200 may be employed for faceted edge growth of a monocrystalline sheet from a melt. Faceted edge growth may refer to the process of drawing a monocrystalline sheet from a melt where a leading edge of a monocrystalline sheet is formed along specific direction with respect to a melt surface.

In embodiments of monocrystalline sapphire growth, the leading edge of a crystalline sheet may be formed using the "A" plane facet of the sapphire crystal structure, forming a 60 degree angle with respect to the crystalline sheet surface (another "A" plane). In FIG. 2A, this crystalline surface may be represented by the surface 222 of crystalline sheet 112. When drawn as a horizontal sheet, the surface 222 may lie parallel to the exposed surface 124 of the melt 106, where the exposed surface 124 of the melt 106 lies in the horizontal plane (X-Z) plane. A monocrystalline sheet may thus be formed by drawing the sheet along a horizontal plane while the surface of the sheet is maintained parallel to the horizontal plane.

In various embodiments, the apparatus 100 may facilitate formation of the crystalline sheet 112 by providing intensive cooling to remove heat from the solid/liquid interface where the crystalline sheet 112 forms near the leading edge 122. In various embodiments the crystallizer 108 may provide this intensive cooling by facilitating a combination of radiative, gas conductive, and gas convective processes. In particular embodiments, the crystallizer 108 may be a cold block positioned in close proximity to the exposed surface 124. The crystallizer 108 may include gas gets in some embodiments to direct cooling gas at the exposed surface 124.

In embodiments where the melt 106 is aluminum oxide, cooling jets may optionally be omitted since gas conduction from the exposed surface 124 and radiation may be sufficient to generate adequate cooling to promote crystallization. This is because, unlike silicon (melting temperature 1412° C.), a sapphire melt (2050° C.) is held at a much higher temperature with respect to a crystallizer and radiation cooling is much stronger ($Q_{radiation} \sim T^4$), where the crystallizer 108 may be a water cooled block.

In addition to the intense cooling provided by crystallizer 108, localized heat flow may be provided from the melt by the heat intensifier 110 in order to stabilize the leading edge growth of crystalline sheet 112. In embodiments of faceted edge growth for forming sapphire sheets, intense heat flow in the melt 106 may be readily accomplished due to the insulating nature of a sapphire (aluminum oxide) melt. For example, the thermal diffusivity of sapphire is $4.5 \times 10^{-7}$ m$^2$/s compared to $2.6 \times 10^{-5}$ m$^2$/s for Si. Moreover, as noted above, the crucible 102 and heat intensifier 110 may be composed of a refractory metal, where the refractory metal is thermally conductive. For example, in some embodiments where tungsten is used for crucible 102 and heat intensifier 110, the thermal conductivity of such components may be 202 W/mK, representative of the thermal conductivity of tungsten metal.

Accordingly, because of the relatively high thermal conductivity of crucible and heat intensifier materials (refractory metals), as well as the relatively low thermal diffusivity of the melt, faceted edge growth of sapphire may in principle be readily accomplished using apparatus 100 or apparatus 200. A challenge for forming high quality crystalline sheet of sapphire or other crystalline materials where density in the solid crystalline phase is higher than in the liquid phase (melt) is the aforementioned sagging of the crystalline sheet below an exposed surface of a melt. In various embodiments, the support apparatus 114 may be used to address this problem by proving support for a crystalline sheet downstream of the crystallizer 108, such as the crystalline sheet 112.

As illustrated in FIG. 1A, the upper surface of the support apparatus 114 may be positioned just below the exposed surface 124. This positioning may aid in maintaining the crystalline sheet 112 flush with the exposed surface 124 as the crystalline sheet 112 is drawn towards the right in the figure. In various embodiments the crucible 102 may have a depth along the Y direction adequate to contain a melt depth for melt 106 of 5 mm to 25 mm. The embodiments are not limited in this context. In some embodiments, the crystalline sheet 112 may be formed to an initial sheet thickness near the leading edge 122 of approximately 0.5 mm to 3 mm. The embodiments are not limited in this context. Accordingly the upper surface of the support apparatus 114 may be positioned approximately 0.5 mm to 3 mm below the exposed surface of the melt, to maintain the surface 222 of the crystalline sheet flush with the exposed surface 124 of the melt 106.

In accordance with different applications a target thickness of the crystalline sheet 112 may be different than the initial sheet thickness of the crystalline sheet 112. Moreover, crystalline sheet thickness may vary from run to run for the same nominal process conditions. As detailed below, the upper surface of the support apparatus 114 may be accordingly be positioned or repositioned to lie sufficiently close to exposed surface 124 of the melt 106 to support the crystalline sheet 112 so the crystalline sheet 112 may remain flush with the exposed surface 124 of the melt. In other words, the surface 222 of crystalline sheet may lie at the same level as the level of exposed surface 124 when the crystalline sheet is drawn over the support apparatus 114.

As further suggested in FIG. 2, as the crystalline sheet 112 is drawn to the right, heaters such as heaters 104 may be employed to adjust heat flow the crystalline sheet 112 to modify the sheet thickness of the crystalline sheet 112 as well as to improve the morphology of the crystalline sheet 112.

Figure 3:
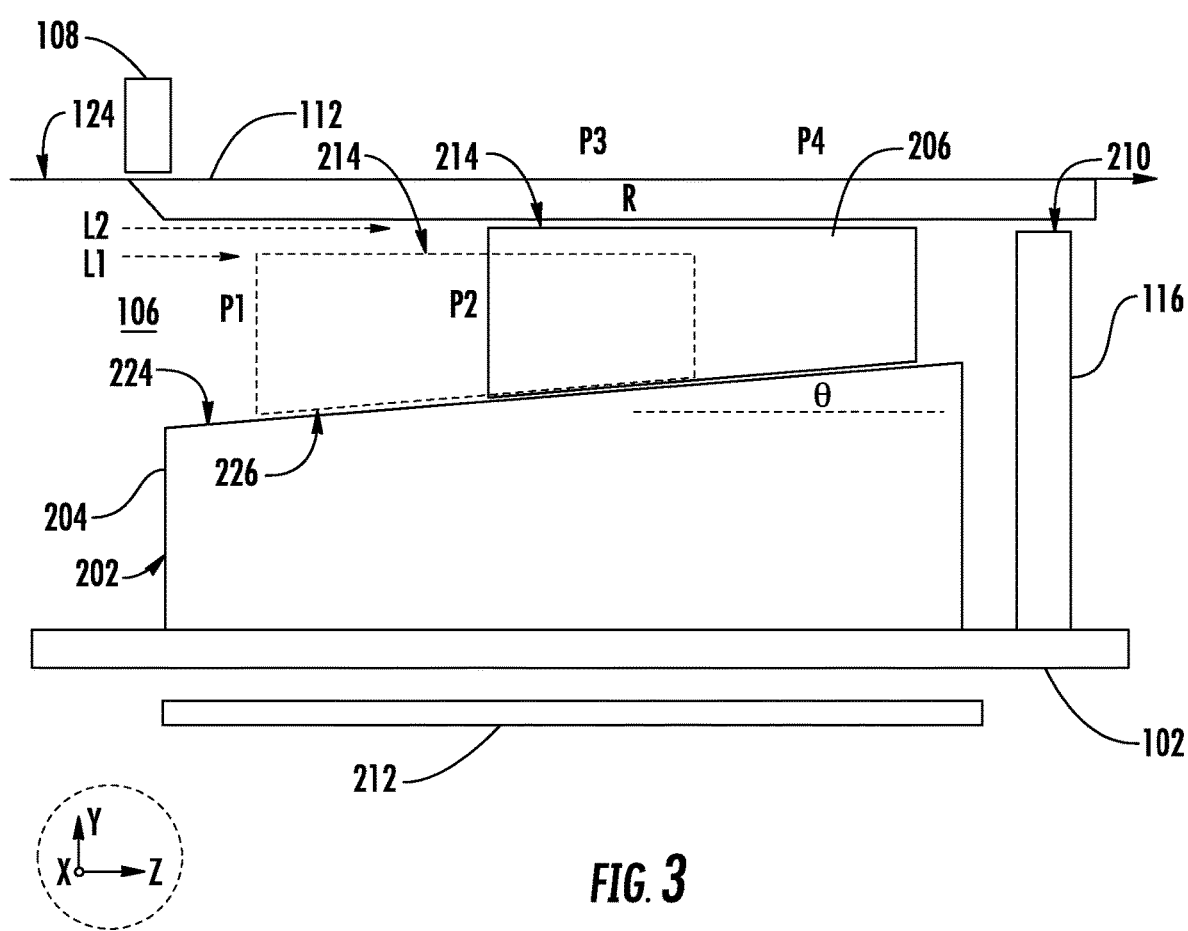
FIG. 3 shows an embodiment of a support apparatus.

In various embodiments, the support apparatus 114 may have multiple portions, where the multiple portions facilitate changing the level of the upper surface of the support apparatus 114. Turning to FIG. 2A, FIG. 2B, and FIG. 3, there is shown a support apparatus 202, where the support apparatus 202 may be a variant of the support apparatus 114. In this configuration, the support apparatus 202 may include a fixed portion 204, where the fixed portion 204 extends from the bottom of the crucible 102. The support apparatus 202 may further include an adjustable portion 206, where the adjustable portion 206 defines an upper surface 214 of the support apparatus 202.

As suggested in FIG. 3, the adjustable portion 206 may be movable at least along the Z-axis. For example, the adjustable portion 206 may be movable from a first position P1 to a second position P2 as shown in FIG. 3. This movability may accommodate process changes such as changes in sheet thickness of the crystalline sheet 112. As shown in FIG. 2A, the level of the exposed surface 124 of the melt 106 may defined by the top 210 of the dam structure 116. In order to facilitate the ability to continuously draw the crystalline sheet 112 from the melt 106, the level of the exposed surface 124 of the melt 106 may be maintained at approximately the level of the top 210 of the dam structure 116. If the level of the exposed surface 124 slightly exceeds the level of the top 210 of the dam structure 116, excess melt may spill over the dam structure 116. Accordingly, by maintaining sufficient amount of melt 106 within the crucible 102 the level of the exposed surface 124 may be defined by the top 210. In this circumstance, in order to maintain the surface 222 of crystalline sheet 112 flush with the exposed surface 124, variations in thickness of the crystalline sheet 112 may be accommodated by the support apparatus 202 in the following manner.

In a first scenario the crystalline sheet 112 may have a thickness of 2 mm. In this circumstance the adjustable portion 206 may be positioned at position P1 as indicated by the dashed structure, wherein the upper surface 214 is disposed at a first level L1 with respect to other parts of the crucible 102 such as the top 210 of the dam structure 116. In the first scenario given a 2 mm thickness for crystalline sheet 112, the surface 222 of crystalline sheet 112 may be flush with the exposed surface 124 of the melt 106. In a second scenario also illustrated in FIG. 3, the support apparatus 202 may be positioned at position P2, as indicated by the solid structure. In the second scenario the upper surface 214 is disposed at a second level L2 with respect to the top 210 of the dam structure 116, and accordingly with respect to the exposed surface 124. In the second scenario, the upper surface 214 is positioned closer to the exposed surface 124. This configuration may be useful if the crystalline sheet 112 is thinner than in the first scenario. For example, the crystalline sheet 112 may have a thickness of 1 mm in the second scenario. Accordingly, to maintain the surface 222 of crystalline sheet 112 flush with the exposed surface 124, the level L2 of upper surface 214 of the support apparatus 202 is closer to the exposed surface 124 to adjust for the lesser thickness of crystalline sheet 112 as compared to in the first scenario. More generally, by merely moving the adjustable portion 206 along a direction parallel to the direction of drawing of the crystalline sheet (Z-axis), the level of the upper surface 214 may be adjusted upwardly or downwardly with respect to the exposed surface of the melt as needed.

In addition to providing support for the crystalline sheet 112, the support apparatus 202 may direct heat toward the exposed surface 124 and in particular toward the crystalline sheet 112 while the crystalline sheet 112 is drawn over the support apparatus 202. For example, a melt-back heater, shown as heater 212, may be disposed under the support apparatus 202, providing heat flowing through the support apparatus 202 to the crystalline sheet 112. In other embodiments a melt-back heater may be disposed within the support apparatus 202. As discussed below, the heat provided by support apparatus 202 may be used to melt back a portion of the crystalline sheet 112 as the crystalline sheet 112 is drawn to the right. In this manner, the roughness of the crystalline sheet 112 may be improved and the thickness of the crystalline sheet 112 may be adjusted to a target sheet thickness before the crystalline sheet 112 is separated from the melt 106. To facilitate transfer of heat to the crystalline sheet 112, in various embodiments, the adjustable portion 206 may be maintained in contact with the fixed portion 204. The adjustable portion 206 and fixed portion 204 may be maintained in contact with one another as the adjustable portion is moved along the Z-axis, for example.

In order to adjust the level of the upper surface 214 and to maintain contact between fixed portion 204 and adjustable portion 206 while the adjustable portion is moved, the adjustable portion may be slidably movable, as suggested in FIG. 3. The fixed portion 204 and adjustable portion 206 may have wedge shapes as shown. The fixed portion 204 may have an upper surface defining a first contact surface 224, where the first contact surface forms a first angle of inclination θ with respect to horizontal. The adjustable portion 206 may have a lower surface defining a second contact surface 226, where the second contact surface 226 is disposed at the first angle of inclination θ with respect to the upper surface 214. In this manner, when the first contact surface 224 and second contact surface 226 are maintained in contact with one another, the upper surface 214 is parallel to the horizontal. In some embodiments, the adjustable portion 206 may be made of a different material from the fixed portion 204 to facilitate movement of the adjustable portion 206 and avoid sticking or welding between the adjustable portion 206 and fixed portion 204.

Returning to FIG. 1A and FIG. 2A, in various embodiments the level of the crystalline sheet 112 may be monitored. For example, the crucible 102 may be disposed in a furnace 140. The furnace 140 may include a window (not shown) where the window facilitates monitoring of the crystalline sheet 112, for example, by visual inspection. In some embodiments, the pull rate of the crystalline sheet 112 may be on the order of 1 mm/s or less. When changes in the level of the crystalline sheet 112 are observed, the support apparatus 202 may adjust the level of the upper surface 214 of adjustable portion 206, for example, in order to maintain the crystalline sheet at a target level, such as flush with the exposed surface 124. Turning also to FIG. 3, while FIG. 3 explicitly illustrates adjustment of the level of the crystalline sheet 112 near the support apparatus 202, the adjustment of the level of upper surface 214 may also have the effect of adjusting the level of the leading edge 122. In this manner the support apparatus 202 may be used to maintain the level of the leading edge 122 at a target position such as flush with the exposed surface 124. As further shown in FIG. 2A the apparatus 200 may include a monitor 215 for measuring sheet thickness or the position of the surface 222 of the crystalline sheet 112 with respect to the exposed surface 124. The monitor may be disposed upstream of the support apparatus 202 as shown. The information regarding crystalline sheet 112 measured by the monitor 215 may be used to adjust the level of the upper surface 214 of the support apparatus in order to maintain the surface 222 of crystalline sheet 112 at a desired level.

FIG. 4 depicts an exemplary heat flow profile 400 provided by embodiments of support apparatus 202. As illustrated, the heat flow may be concentrated above the adjustable portion 206. This concentration of heat flow may be employed to melt back at least a portion of the crystalline sheet 112. By providing sufficient heat flux, such as approximately 4 W/cm$^2$ to 5 W/cm$^2$ to the crystalline sheet 112, the underside of the crystalline sheet may be melted as the crystalline sheet is drawn over the support apparatus 202, as shown in FIG. 3. This melting of the underside of the crystalline sheet 112 may provide a constant fluid interface between the crystalline sheet 112 and the support apparatus 202, providing a lubrication analogous to movement of a skate over the surface of ice. In this manner the adjustable portion 206 of support apparatus 202, by virtue of conducting heat supplied by a meltback heater, may provide a low friction bearing surface for the crystalline sheet 112 when the crystalline sheet 112 is drawn over the support apparatus 202.

FIG. 5A and FIG. 5B depict two different scenarios during processing of a crystalline sheet using the support apparatus 202 in accordance with embodiments of the disclosure. In particular, a crystalline sheet 112 is shown in transverse cross-section perpendicular to the pull direction, where the pull direction lies along the Z-axis as illustrated further, for example, at FIG. 2A. Referring also to FIG. 3, there is shown a first scenario in FIG. 5A where a region R of the crystalline sheet 112 is disposed over the point P3 of the support apparatus 202. As the crystalline sheet 112 is drawn to the right the region R also moves to the right. In the second scenario shown in FIG. 5B, the region R is disposed over the point P4 of the support apparatus 202. Accordingly, the scenario of FIG. 5B represents the state of the region R of the crystalline sheet 112 at a later point in time as compared to the scenario of FIG. 5A.

As also shown in FIG. 5A a melt region 502 may be disposed between the crystalline sheet 112 and adjustable portion 206. The melt region 502 may form at least in part due to heat transferred to the crystalline sheet 112. As further shown in FIG. 5A the crystalline sheet 112 may initially exhibit a larger roughness on the underside of crystalline sheet 112 adjacent the melt region 502. The support apparatus 202 may advantageously reduce the roughness of crystalline sheet 112 by providing adaptive melt-back, meaning preferential melt back of thicker regions of the crystalline sheet. This adaptive melt back may lead to a better thickness uniformity of crystalline sheet 112, where roughness is reduced as shown in FIG. 5B. In particular, in embodiments where the melt region 502 is an alumina melt and the crystalline sheet 112 is sapphire, the melt region 502 has a relatively high thermal resistivity. Accordingly, in regions 506 where the crystalline sheet 112 is relatively thicker, the portions 504 of the melt region 502 between the regions 506 and adjustable portion 206 is relatively thinner. Accordingly, the regions 506 present locations of low thermal resistance, allowing heat 508 to be funneled into the crystalline sheet 112, resulting in larger melt-back. Conversely, below regions 510 of crystalline sheet 112 where thickness is less, an adjacent melt region, shown as melt region 512, has greater thickness. This greater melt thickness presents a higher thermal resistance, blocking the flow of heat, and resulting in a lesser degree of melt-back of the crystalline sheet in melt regions 512. This adaptive melt-back process may lead to a smoother crystalline sheet, as well as a thinner crystalline sheet, as shown in FIG. 5B.

An advantage provided by directing heat through the support apparatus 202 to melt back a crystalline sheet 112 as shown in FIGS. 5A and 5B is the more precise control of heat applied to a crystalline sheet when the crystalline sheet and support apparatus are in such close proximity. For example, the average thickness of the melt region 502 may be less than one mm in some examples. This may be especially advantageous when employed to process sapphire sheets. The differences in properties of sapphire and silicon (sapphire: kinematic viscosity $1.88 \times 10^{-5}$ m2/s, thermal diffusivity $4.62 \times 10^{-7}$ m2/s, and thermal expansion coefficient $3.6 \times 10^{-4}$/K; silicon: kinematic viscosity $3.14 \times 10^{-7}$ m2/s, thermal diffusivity $2.61 \times 10^{-5}$ m2/s, and thermal expansion coefficient $1.0 \times 10^{-4}$/K) results in the Rayleigh number being much higher for sapphire, resulting in the likelihood of creating natural convection cells in regions of a melt having a depth of approximately 1 cm. The Rayleigh number Ra is defined as $$Ra = \frac{g\beta}{\nu\alpha}(T_b - T_u)L^3, \tag{1}$$

where g is the gravitational constant, β is the thermal expansion coefficient, ν is the kinematic viscosity, α is the thermal diffusivity, $T_b$, $T_u$ are the temperatures of the upper and lower boundaries, and L is the depth of the melt. Computational fluid dynamics modeling of alumina melt behavior in an apparatus arranged similarly to apparatus 100 shows the development of convective cells within "deep" regions of the melt where the melt extends from the crucible bottom to the exposed surface, for approximately 15 mm. Additionally, convective cell formation is suppressed in the regions where the melt is thin, such as over a support apparatus 114 where the melt thickness may vary from approximately 3 mm to less than one millimeter. Thus much greater control and predictability of the heat flux in provided in certain areas, such as at the melt back area above the support apparatus 114.

Figure 6:
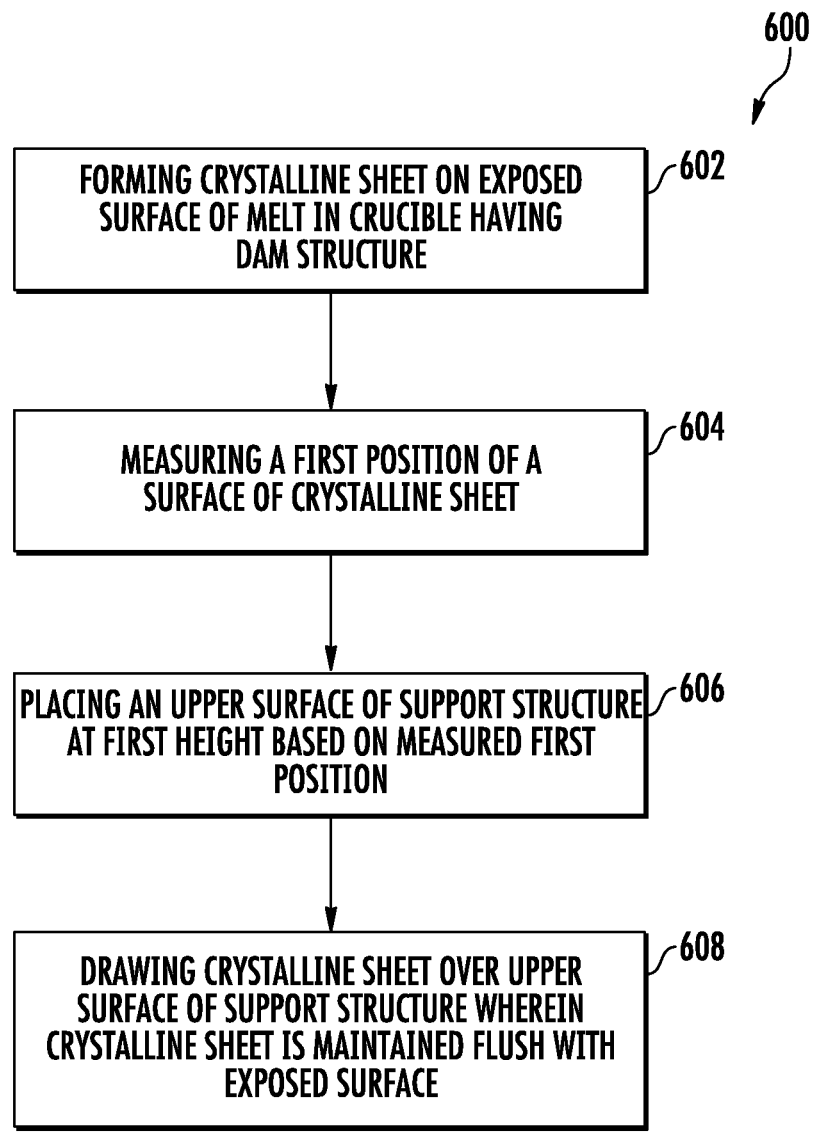
FIG. 6 depicts an exemplary process flow.

FIG. 6 depicts an exemplary process flow 600. At block 602, the operation is performed of forming a crystalline sheet on an exposed surface of a melt in a crucible having a dam structure. In various embodiments, the exposed surface of the melt may be defined by a top of the dam structure.

At block 604, a first position of a surface of the crystalline sheet is measured. The first position may be measured with respect to the exposed surface. The first position may be measured downstream of a crystallizer. At block 606, an upper surface of a support apparatus is placed at a first height based upon the measured first position. The support apparatus may be disposed downstream of a location where the measurement of the first sheet thickness takes place. At block 608, the crystalline sheet is drawn over the upper surface of the support apparatus wherein the crystalline sheet is maintained flush with the exposed surface.

Advantages of the present embodiments include the ability to both thin a crystalline sheet and increase the thickness uniformity of the crystalline sheet using a support apparatus having a novel design. Other advantages include the ability to maintain a crystalline sheet flush with a melt surface, facilitating the ability to draw crystalline sheets from a melt in a horizontal direction even when the density of the crystalline sheet is greater than the density of the melt.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize the usefulness of the embodiments of the present disclosure is not limited thereto and the present embodiments may be beneficially implemented in any number of environments for any number of purposes. Accordingly, the claims set forth below should be construed in view of the full breadth and spirit of the present disclosure as described herein.

What is claimed is:

1. An apparatus for drawing a crystalline sheet from a melt, comprising:
   a crucible configured to contain the melt and having a dam structure, the melt comprising an exposed surface having a level defined by a top of the dam structure; a support apparatus disposed within the crucible and having an upper surface, wherein the crystalline sheet is maintained flush with the exposed surface of the melt when drawn over the support apparatus, wherein the upper surface of the support apparatus is disposed below the crystalline sheet and parallel to the exposed surface of the melt, wherein the support apparatus comprises:
   a fixed portion extending from a bottom of the crucible; and
   an adjustable portion, the adjustable portion defining the upper surface of the support apparatus, wherein the adjustable portion is movable from a first position where the upper surface is disposed at a first level with respect to the top of the dam structure, to a second position where the upper surface is disposed at a second level with respect to the top of the dam structure.

2. The apparatus of claim 1, wherein the melt comprises aluminum oxide and the crystalline sheet comprises sapphire.

3. The apparatus of claim 1, wherein the adjustable portion is in contact with the fixed portion in the first position and second position.

4. The apparatus of claim 1, wherein the fixed portion has a first contact surface defining a first angle of inclination with respect to a horizontal, wherein the adjustable portion has a second contact surface in contact with the first contact surface and disposed at the first angle of inclination, and wherein the upper surface of the support apparatus is parallel to the horizontal.

5. The apparatus of claim 1, wherein the support apparatus comprises a refractory metal.

6. The apparatus of claim 1, further comprising a gas jet disposed downstream of the dam structure directing a stream of gas to the melt adjacent the dam structure.

7. The apparatus of claim 6, the gas jet generating a first curvature of a meniscus between the melt and support apparatus different than a second curvature of the meniscus between the melt and support apparatus when the gas jet is not present.

8. An apparatus for growing a crystalline sheet from a melt, comprising:
   a crucible configured to contain the melt and having a dam structure, the melt having an exposed surface defined by a top of the dam structure;
   a crystallizer disposed above the melt to remove heat in a cooling zone from the exposed surface of the melt, wherein a leading edge of the crystalline sheet forms at the exposed surface in the cooling zone, the crystalline sheet having an initial sheet thickness; and
   a support apparatus disposed within the crucible beginning and ending downstream of the crystallizer and having an upper surface, wherein the crystalline sheet is maintained flush with the exposed surface of the melt when drawn over the support apparatus, wherein the upper surface of the support apparatus is parallel to the exposed surface of the melt.

9. The apparatus of claim 8, wherein the melt comprises aluminum oxide and the crystalline sheet comprises sapphire.

10. The apparatus of claim 8, wherein the support apparatus comprises:
    a fixed portion extending from a bottom of the crucible; and
    an adjustable portion, the adjustable portion defining the upper surface of the support apparatus, wherein the adjustable portion is movable from a first position where the upper surface is disposed at a first level with respect to the top of the dam structure, to a second position where the upper surface is disposed at a second level with respect to the top of the dam structure.

11. The apparatus of claim 10, wherein the adjustable portion is in contact with the fixed portion in the first position and second position.

12. The apparatus of claim 10, wherein the fixed portion has a first contact surface defining a first angle of inclination with respect to a horizontal, wherein the adjustable portion has a second contact surface in contact with the first contact surface and disposed at the first angle of inclination, and wherein the upper surface of the support apparatus is parallel to the horizontal.

13. The apparatus of claim 8, wherein the support apparatus comprises a refractory metal.

14. The apparatus of claim 8, further comprising a melt-back heater directing heat through the upper surface of the support apparatus to partially melt the crystalline sheet when the crystalline sheet is drawn over the support apparatus.

15. The apparatus of claim 14, the melt-back heater disposed below a section of the crucible adjacent the support apparatus.

16. An apparatus for drawing a crystalline sheet from a melt, comprising:

a crucible configured to contain the melt and having a dam structure, the melt comprising an exposed surface having a level defined by a top of the dam structure;

a support apparatus disposed within the crucible and having an upper surface, wherein the crystalline sheet is maintained flush with the exposed surface of the melt when drawn over the support apparatus; and a melt-back heater directing heat through the upper surface of the support apparatus to partially melt the crystalline sheet when the crystalline sheet is drawn over the support apparatus, wherein the support apparatus comprises:

a fixed portion extending from a bottom of the crucible; and an adjustable portion, the adjustable portion defining the upper surface of the support apparatus, wherein the adjustable portion is movable from a first position where the upper surface is disposed at a first level with respect to the top of the dam structure, to a second position where the upper surface is disposed at a second level with respect to the top of the dam structure.

* * * * *